United States Patent
Botez et al.

(10) Patent No.: US 8,428,093 B2
(45) Date of Patent: Apr. 23, 2013

(54) HIGH-POWER QUANTUM CASCADE LASERS WITH ACTIVE-PHOTONIC-CRYSTAL STRUCTURE FOR SINGLE, IN-PHASE MODE OPERATION

(75) Inventors: Dan Botez, Madison, WI (US); Jeremy Daniel Kirch, Middleton, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 242 days.

(21) Appl. No.: 13/046,269

(22) Filed: Mar. 11, 2011

(65) Prior Publication Data

US 2012/0230358 A1    Sep. 13, 2012

(51) Int. Cl.
*H01S 5/00*    (2006.01)

(52) U.S. Cl.
USPC ............ 372/43.01; 372/45.01; 372/50.12

(58) Field of Classification Search ........... 372/43.1, 372/45.01, 50.12
See application file for complete search history.

(56) References Cited

U.S. PATENT DOCUMENTS

| | | | |
|---|---|---|---|
| 4,860,298 A | 8/1989 | Botez et al. | |
| 4,985,897 A | 1/1991 | Botez et al. | |
| 5,297,158 A | 3/1994 | Naitou et al. | |
| 5,337,074 A | 8/1994 | Thornton | |
| 5,386,429 A | 1/1995 | Naito et al. | |
| 5,587,334 A | 12/1996 | Naito et al. | |
| 5,930,278 A | 7/1999 | Menigaux | |
| 7,403,552 B2 | 7/2008 | Botez et al. | |
| 7,408,966 B2 | 8/2008 | Botez | |
| 7,457,338 B2 | 11/2008 | Mawst et al. | |
| 2006/0067375 A1 | 3/2006 | Yamada et al. | |
| 2006/0203865 A1 | 9/2006 | Bour et al. | |
| 2007/0025406 A1 | 2/2007 | Yamada et al. | |
| 2008/0043794 A1 | 2/2008 | Botez | |
| 2012/0201263 A1 | 8/2012 | Botez et al. | |

FOREIGN PATENT DOCUMENTS

| | | |
|---|---|---|
| JP | 05-167175 A | 7/1993 |
| WO | WO 2011/084201 | 7/2011 |

OTHER PUBLICATIONS

Bai et al., Electrically pumped photonic crystal distributed feedback quantum cascade lasers, Applied Physics Letters, vol. 91, No. 144423, Oct. 5, 2007, pp. 1-3.
Li, High Power, single-mode operation from photonic-lattice semiconductor lasers with controllable lateral resonance, Applied Physics Letters, vol. 88, No. 091112, Mar. 2, 2006, pp. 1-3.
Yeh, Optical properties of dual-state Fabry-Perot etalons, Optics Letters vol. 17, No. 24, Dec. 15, 1992, pp. 1818-1820.
Kashyap, Surface Plasmon Resonance-Based Fiber and Planar Waveguide Sensors, Journal of Sensors, vol. 2009, Article ID 645162, 2009, pp. 1-8.
Bismuto, Large cavity quantum cascade lasers with InP interstacks, Applied Physics Letters vol. 93, No. 231104, Dec. 9, 2008, pp. 1-3.
International Search Report and Written Opinion issued in PCT/US2012/023074, Oct. 29, 2012.

*Primary Examiner* — Armando Rodriguez
(74) *Attorney, Agent, or Firm* — Bell & Manning, LLC

(57) ABSTRACT

Semiconductor laser array devices capable of emitting mid- to long-wavelength infrared (i.e., 4-12 μm) radiation are provided. The devices include a quantum cascade laser (QCL) structure comprising one or more active cores; an optical confinement structure; a cladding structure, and a plurality of laterally-spaced trench regions extending transversely through the cladding and optical confinement structures, and partially into the QCL structure. The trench regions define a plurality of laterally-spaced interelement regions separated by element regions in the laser array device. The element regions are characterized by a non-uniform structure across their widths. As a result of this structural non-uniformity, array modes composed of coupled first-order lateral modes of the element regions are preferentially suppressed relative to array modes composed of coupled fundamental lateral modes of the element regions.

17 Claims, 8 Drawing Sheets

HIGH-POWER QUANTUM CASCADE LASERS WITH ACTIVE-PHOTONIC-CRYSTAL STRUCTURE FOR SINGLE, IN-PHASE MODE OPERATION

STATEMENT OF GOVERNMENT RIGHTS

This invention was made with government support under W911NF-11-C-007 awarded by the ARMY/ARO and 0925104 awarded by the National Science Foundation. The government has certain rights in the invention.

BACKGROUND

Compact laser sources emitting in the mid- to long-wavelength infrared (MWIR to LWIR) range (i.e., 4-12 µm) are currently of great interest for spectroscopic applications such as missile-avoidance systems, laser photo-acoustic spectroscopy (LPAS), homeland security applications, illuminators for range finding in defense applications, medical diagnostics and free-space communications. However the lack of sufficiently powerful, compact sources has so far drastically limited the development in these fields.

SUMMARY

One aspect of the invention provides semiconductor laser array devices comprising a quantum cascade laser structure. The quantum cascade laser structure comprises at least one core, an optical confinement structure comprising at least one upper layer of optical confinement material above the quantum cascade laser structure and at least one lower layer of optical confinement material below the quantum cascade laser structure, a cladding structure comprising at least one upper layer of cladding material above the optical confinement structure and, optionally, at least one lower layer of cladding material below the optical confinement structure, and a plurality of laterally-spaced trench regions extending transversely, at least partially into the quantum cascade laser structure. Each trench region comprises a lower trench layer comprising a semi-insulating material and an upper trench layer comprising a material having a refractive index that is higher than that of the semi-insulating material. In addition to the lower and upper trench layers, each trench region can further comprise a layer of thermally conducting material disposed above the upper trench layer. The trench regions define interelement regions separated by element regions in the laser array devices. A layer of metal can optionally be disposed over the entire upper surface of the devices. In some embodiments of the devices, for the interelement regions the distance between the lower surface of the layer of metal and the uppermost surface of the quantum cascade laser structure is smaller than for the element regions in order to improve heat removal from the quantum cascade laser structure.

The element regions are characterized by a non-uniform structure across their widths. As a result of this lateral structural non-uniformity, array modes composed of coupled first-order lateral modes of the element regions are preferentially suppressed relative to array modes composed of coupled fundamental lateral modes of the element regions. The non-uniform structure across the width of an element region can take on a variety of forms. For example, in some embodiments, the structural non-uniformity is provided by absorption loss regions comprising a metal and extending transversely at least partially through the upper cladding layer along the edges of the element region, and, in some embodiments, through the upper cladding layer and into the upper optical confinement layer. In other embodiments, the lateral structural non-uniformity is provided by a diffraction grating disposed within or above the upper optical confinement layer of the element region.

The laser array devices are characterized in that they are generally designed to produce an array mode composed of coupled fundamental lateral modes meeting a lateral resonance condition in which there is strong coupling via leaky waves between all of the element regions. For most applications, the preferred array mode is of the in-phase type, meaning that the fundamental lateral modes of all elements are in phase with each other.

Some embodiments of the devices are configured to emit at 8 µm with at least 2.5 Watts of coherent average output power during continuous or quasi-continuous wave operation. In some such embodiments, the devices are configured to provide a wallplug efficiency of at least 15%.

Another aspect of the invention provides methods of making a semiconductor laser array device of the type described above. These methods comprise forming a plurality of laterally-spaced trenches in a structure, as described above, growing a lower trench layer in each of the trenches, the lower trench layer comprising a semi-insulating material and growing an upper trench layer in each of the trenches, the upper trench layer comprising a material having a refractive index that is higher than the refractive index of the semi-insulating material, whereby a plurality of element regions separated by interelement regions are defined in the laser array device.

BRIEF DESCRIPTION OF THE DRAWINGS

FIG. 1(a) shows a schematic representation of a laser having an active-photonic-crystal (APC) structure and operating in the resonant in-phase optical array mode composed of coupled fundamental element modes.

DETAILED DESCRIPTION

Figure 1:
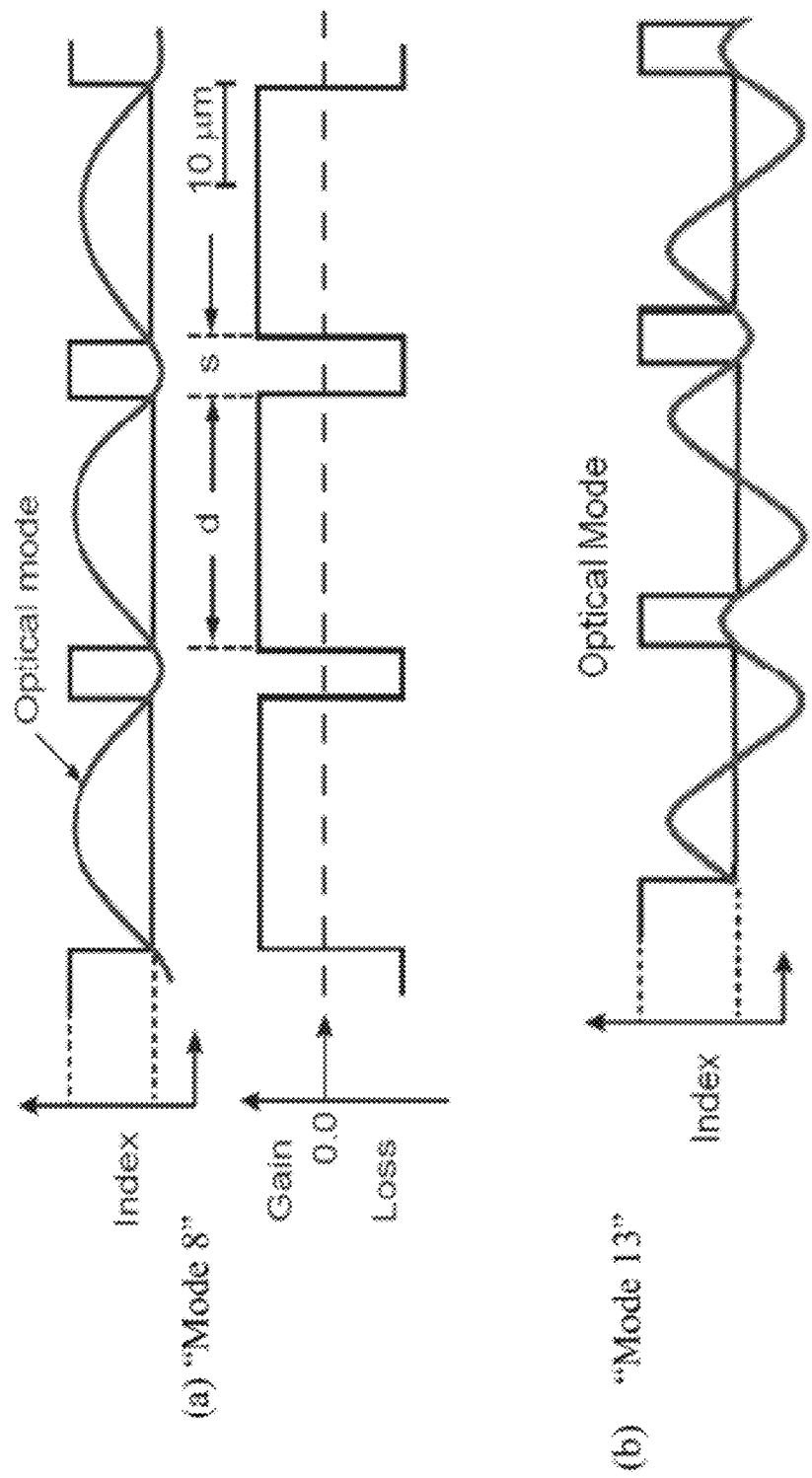
FIG. 1 (b) shows a schematic representation of a resonant optical array mode composed of out-of-phase coupled first-order element modes. Since both array modes are resonant they have negligible field in the interelement regions.

Semiconductor laser array devices capable of emitting mid- to long-wavelength infrared (i.e., 4-12 µm) radiation are provided. The devices are capable of operating at high power and high wallplug efficiency during quasi-continuous wave or continuous wave (CW) operation. The devices are suitable for use in a variety of applications, including missile-avoidance systems, laser photo-acoustic spectroscopy, illuminators for targets in military defense range finding, medical diagnostics, free-space communications and laser marking of packaging.

In a basic embodiment, the devices include a quantum cascade laser (QCL) structure comprising one or more active cores; an optical confinement structure; a cladding structure; and a plurality of laterally-spaced trench regions extending transversely through the upper optical confinement and cladding structures, and at least partially into the QCL structure. The optical confinement structure can include one or more upper layers of optical confinement material above the QCL structure and one or more lower layers of optical confinement material below the QCL structure. The cladding structure can include one or more upper layers of cladding material above the optical confinement structure and one or more lower layers of cladding material below the optical confinement structure.

The trench regions, each of which comprises a lower trench layer comprising a semi-insulating material and an upper trench layer comprising a material having a refractive index that is higher than that of the semi-insulating material, define a plurality of laterally-spaced interelement regions separated by element regions in the laser array device. In addition, boundary regions of high refractive index or of high effective refractive index for the fundamental transverse mode can be provided adjacent to the element regions at the outer edges of the laser array device. These boundary regions are desirably composed of the same materials as the trench regions.

The element regions in the present devices are characterized by a non-uniform structure across their widths. The result of this non-uniformity is that undesirable array modes composed of coupled higher-order lateral modes of the element regions are preferentially suppressed relative to array modes composed of coupled fundamental lateral modes of the element regions. In particular, array modes composed of out-of-phase coupled first-order modes that peak near the edges of the element regions are preferentially suppressed relative to array modes composed of coupled fundamental modes that peak in the center of the element regions. The non-uniform structure across the widths of the element regions can take on a variety of forms and can suppress unwanted modes by preferentially inducing absorption losses for those modes, providing preferential feedback for the array modes composed of coupled fundamental modes, or both.

The resulting laser array devices are configured to provide an active-photonic-crystal (APC) laser structure having an in-phase array mode composed of coupled fundamental modes that meets a specific lateral resonance condition for which there is strong coupling between all element regions via leaky waves. A description of such lateral resonance conditions for an antiguided laser array can be found on pages 50-53 of D. Botez, "Monolithic Phase-Locked Semiconductor Laser Arrays." Chapter I of the book "Diode Laser Arrays" by D. Botez and D. R. Scifres eds., Cambridge University Press, July 1994.

FIG. 1 shows a schematic diagram of an APC laser structure for which the lateral resonance condition for the in-phase array mode composed of coupled fundamental modes is met. In the semiconductor laser array device represented by FIG. 1, gain preferentially enhanced on the element regions of the APC can provide single-spatial mode operation to high average powers (e.g., about 2.5-3.0 W) with high (e.g., >15%) wallplug efficiency from a device having only three or four element regions. In this device, the desired in-phase mode is favored to lase since ~99% of its energy lies in the high-gain element regions, while nonresonant array modes are discriminated against via optical loss in the interelement regions and resonant array modes composed of coupled high-order element modes are discriminated against via preferential suppression in the element regions.

Figure 2:
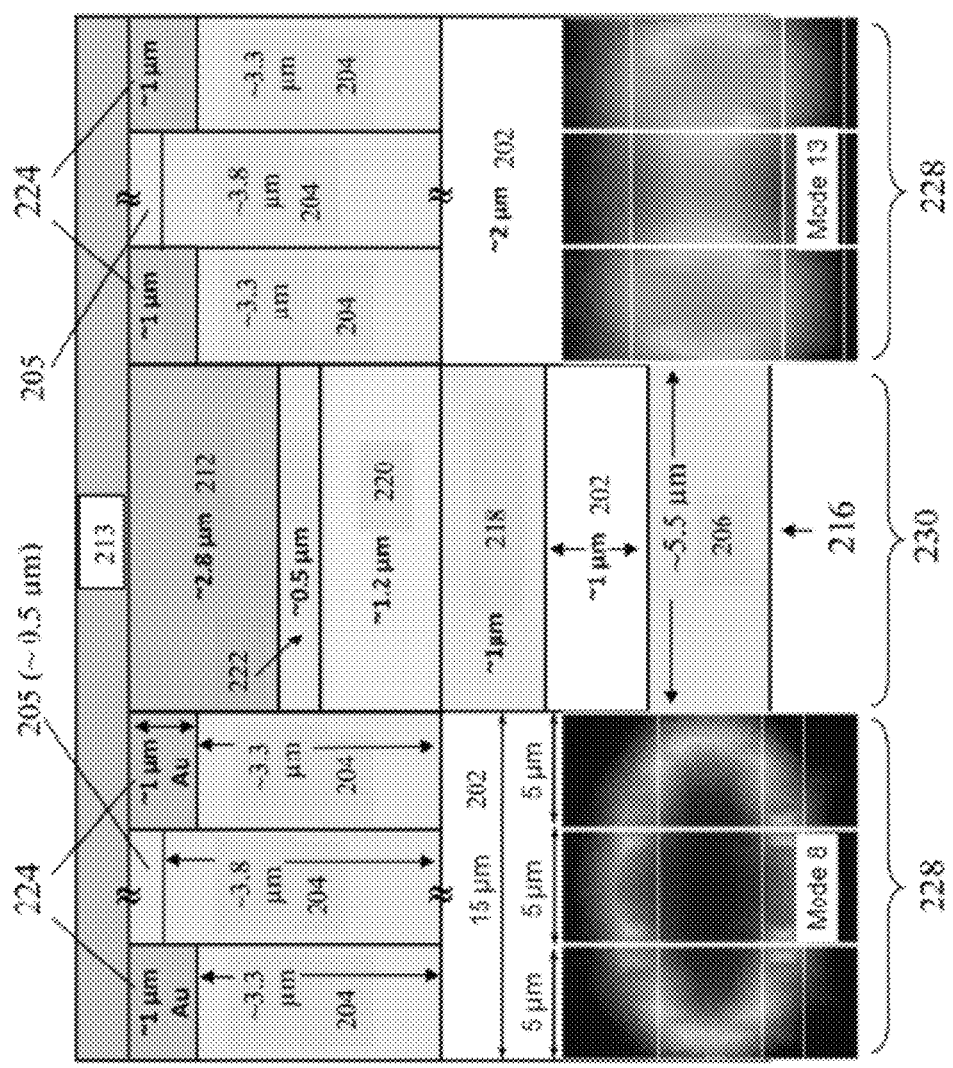
FIG. 2 shows a schematic cross-sectional view of one embodiment of a quantum cascade laser having an APC structure that includes absorption loss regions at the edges of the element regions.

One embodiment of a semiconductor laser array device having an APC structure is shown schematically in FIG. 2. For purposes of illustration, the device of FIG. 2 is described in terms of an InP-based system. However, the structure could be based on other semiconductor systems, such as GaAs or GaSb. Representative dimensions for the various regions in the device are provided in the figure. However, these dimensions are provided as examples only. Dimensions other than those depicted in the figure can be used. As shown in the device of FIG. 2, the QCL structure of the device comprises a core 202 composed of a superlattice of quantum wells and barriers. The core provides multiple coupled laser stages (e.g., at least 10, at least 25 or at least 40), each of which includes an electron injector, an active lasing region having at least one quantum well, and an electron extractor. The core desirably includes laser stages having a deep-well structure. In a deep-well structure, the quantum wells in the active lasing region have a well bottom that is lower in energy than the bottoms of the quantum wells in the adjacent electron injector. The use of a deep-well structure is advantageous because it suppresses carrier leakage, rendering the device's performance less sensitive to temperature variations and allowing for more powerful and efficient operation. Another desirable structure for the laser stages is a tapered-active structure. In a tapered-active structure the tops of the barriers in the active lasing region generally increase in energy from the injection barrier to the exit barrier, which in turn also results in suppression of carrier leakage. A description of a QCL structure with tapered active region can be found in D. Botez et al., *Proc. SPIE Novel In-Plane Semiconductor Lasers X Conf*, Vol. 7953, Paper 76530N, 2011. In some embodiments, the QCL structure can include more than one core. A description of a QCL structure having multiple cores can be found in Bismuto et al., *Appl. Phys. Lett.*, 93, 231104 (2008).

Figure 3:
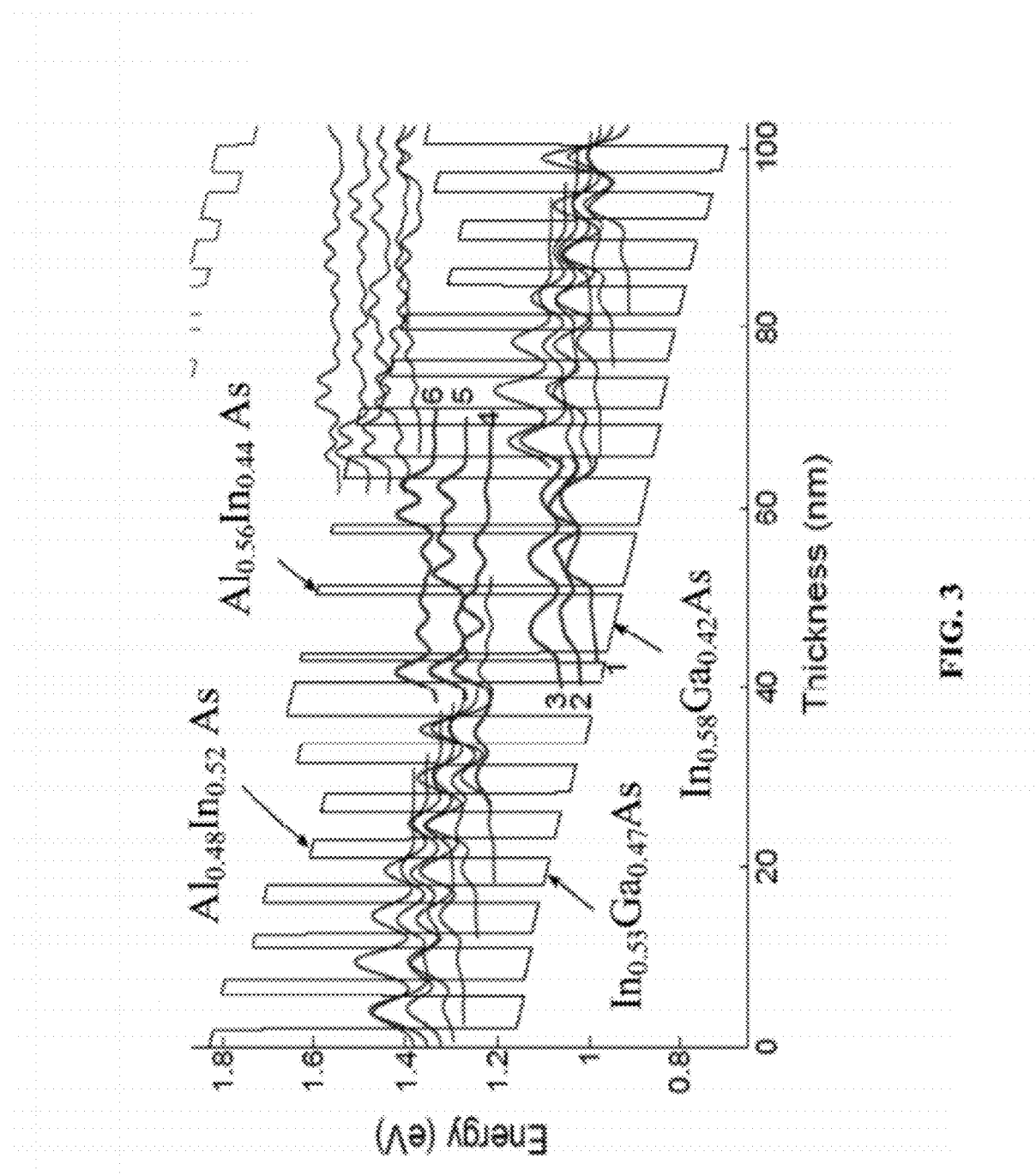
FIG. 3 shows the conduction-band energy diagram for one stage of a quantum cascade laser structure having a deep-well structure.

FIG. 3 shows the conduction-band energy diagram for one stage in one embodiment of a quantum cascade laser structure having a deep-well structure and designed to emit in the 8-9 µm range. The quantum cascade laser structure of this embodiment is a deep-well structure comprising alternating layers of AlInAs and InGaAs. The structure can be grown by metal-organic chemical vapor deposition (MOCVD) to produce a multilayered structure that includes the various well and barrier layers that make up the core. A more detailed description of deep-well quantum cascade laser structures can be found in U.S. Pat. No. 7,403,552 and No. 7,558,305.

Figure 4:
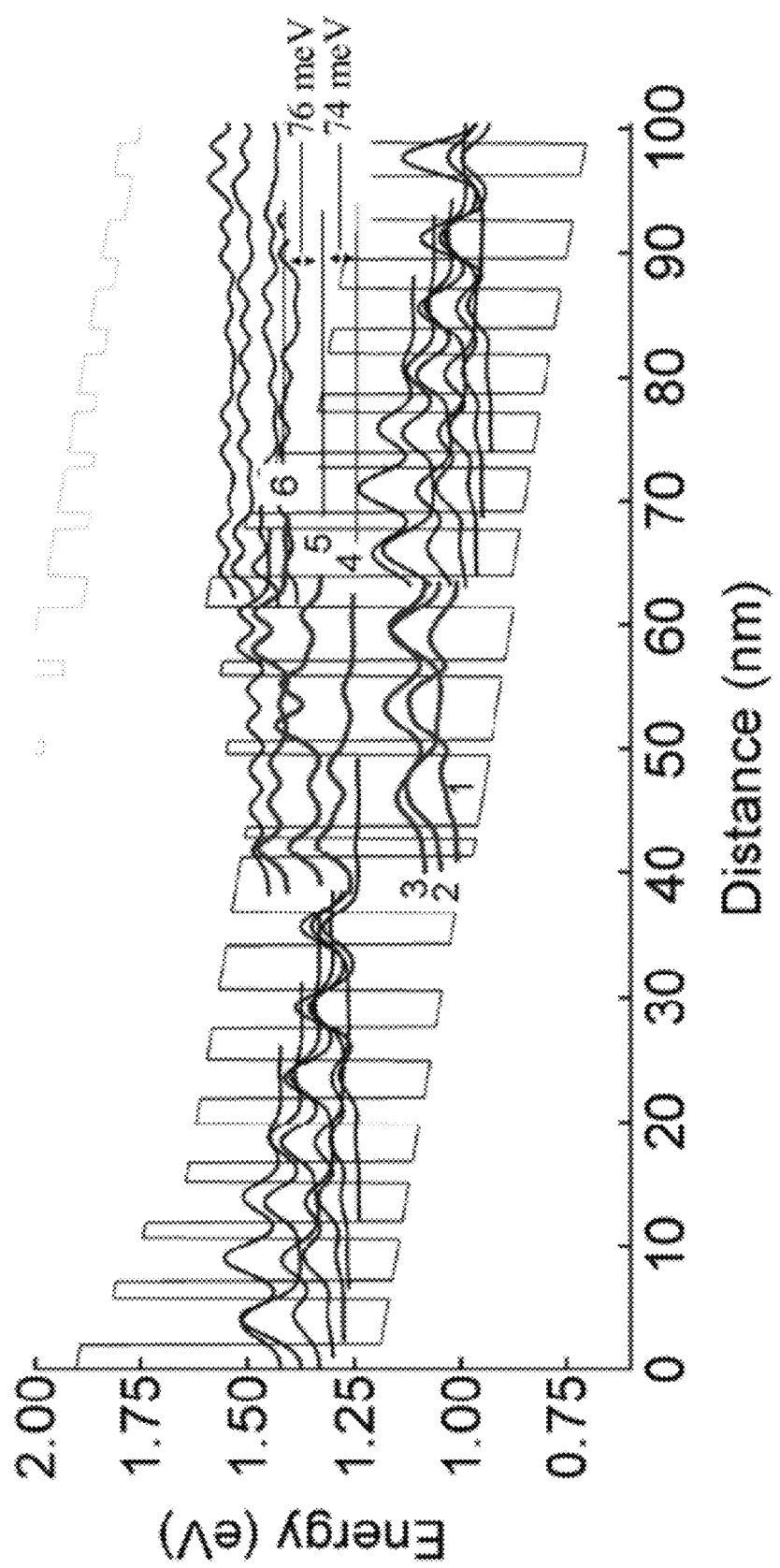
FIG. 4 shows the conduction-band energy diagram for one stage of a quantum cascade laser structure having a tapered-active structure.

FIG. 4 shows the conduction-band energy diagram for one stage in one embodiment of a quantum cascade laser structure having a tapered-active structure and designed to emit in the 8-9 µm range. The energy differences between states 5 and 4, $E_{54}$ and states 6 and 5, $E_{65}$ have increased with respect to the untapered design from 55 meV to 74 meV, and from 59 meV to 76 meV, respectively. These increases strongly impact the scattering rates from one energy state to the next upper energy state, since the scattering rate is proportional to $\exp[-\Delta E/kT]$, where $\Delta E$ is the energy difference. For instance, at room temperature the scattering rate from state 4 to state 5 decreases by more than a factor of two; more specifically by 52%. That is, the electron-leakage current decreases by 52%, and then one obtains much lower sensitivity to temperature variations of both the threshold current and the slope efficiency. In addition, the upper-state lifetime, $\tau_4$ increases from 1.25 ps to 1.52 ps, which in turn decreases the threshold-current density $J_{th}$ by ~22%. In turn QCLs can reach both higher quasi-CW or CW power levels as well as higher quasi-CW or CW wallplug-efficiency values The optical confinement structure of the present devices includes at least one lower layer of optical confinement material and at least one upper layer of optical confinement material. In some embodiments the optical confinement structure can include more than one upper and/or lower layer of optical confinement material. In the device of FIG. 2, the optical confinement structure includes lower and upper optical confinement layers 204, 206 (e.g., n⁻-InP). In this device, the upper optical confinement layer 204 is narrower at the top due to the absorption loss regions 224 (discussed below) that extend into the upper optical confinement layer at the edges of the element region.

Like the optical confinement structure, the cladding structure can include more than one upper layer and more than one lower layer of cladding material. For example, a device such as that shown in FIG. 2 can include a cladding structure with an upper cladding layer 205 (e.g., n⁺-InP). A lower cladding layer can be provided by a substrate layer (e.g., n-InP) upon which the device is grown. In addition, the cladding structure can include an additional upper cladding layer (e.g., n⁺⁺-InP). The optical confinement layers are selected to provide appropriate electrical conduction across them and to have an appropriate index of refraction so as to cooperate with the cladding layers to provide optical confinement of the emitted light to the QCL structure. An additional cladding layer can be employed to suppress absorption losses by the fundamental transverse mode to one or more layers of metal 213 (e.g., Au) deposited on the structure. Although FIG. 2 depicts a device wherein the absorption loss regions extend through the upper cladding structure and into the upper optical confinement structure, other designs are possible. For example, in other embodiments the absorption loss regions extend only partially through the upper cladding structure, or can stop at the interface of the upper cladding structure and the upper optical confinement structure. Thus, in embodiments of the devices that include absorption loss regions at the edges of the element regions, the upper cladding structure and, in some cases, the upper optical confinement structure do not extend across the width of the element regions along their entire length.

Figure 5:
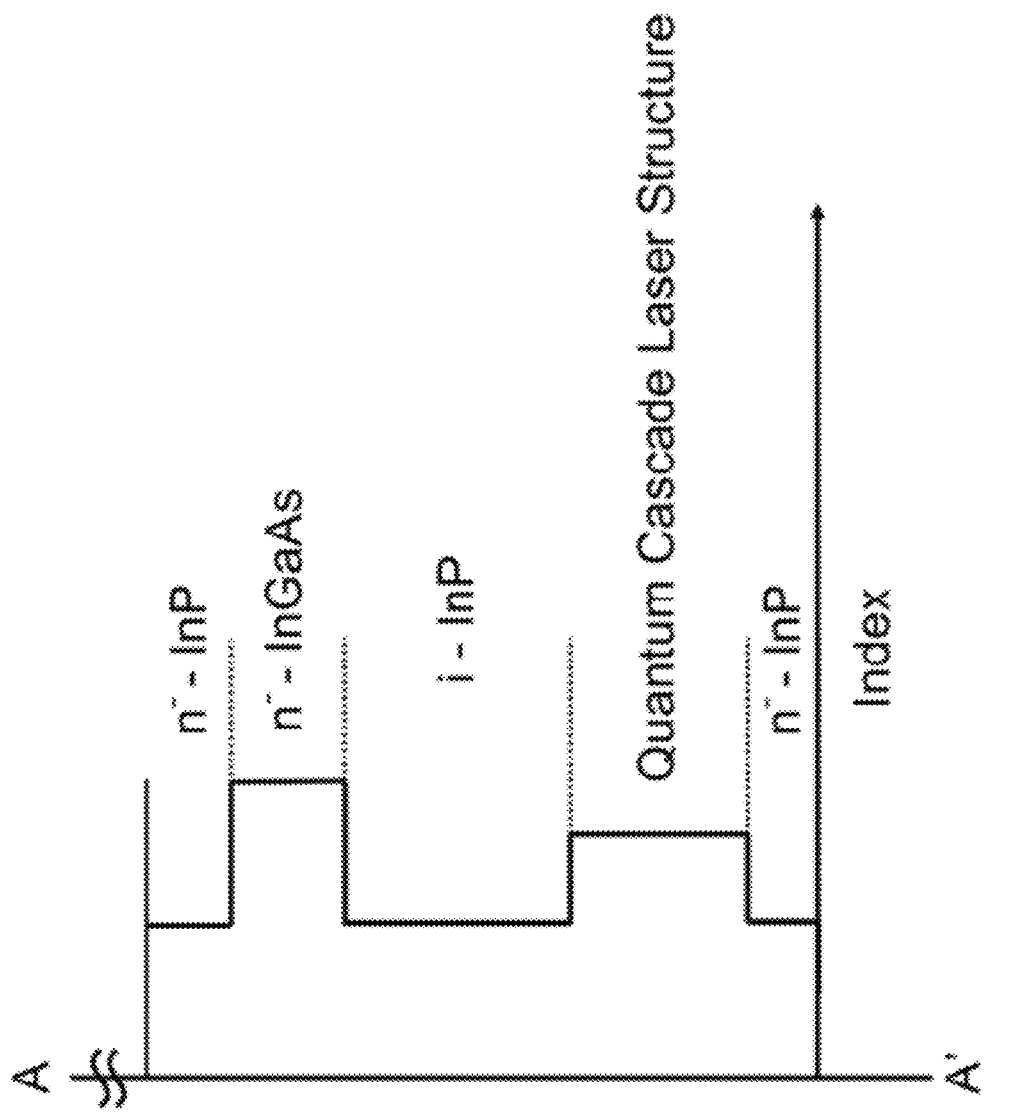
FIG. 5 shows the transverse refractive index profile for the interelement region of the device in FIG. 2.

The interelement regions of the laser array device correspond to a plurality of trench regions, which are filled trenches 216 extending through the upper cladding and upper optical confinement structures and partially into the QCL structure 202. Each of the filled trenches includes a lower trench layer 218 adjacent to the QCL structures in the neighboring element regions, the lower trench layer comprising a semi-insulating material (e.g., Fe-doped InP or semi-insulating InP) to prevent current leakage through the low voltage portion of the QCL structure into which the filled trench extends. The filled trenches may extend a considerable distance into the QCL structure. For example, in some embodiments the filled trenches extend through at least 25% of the QCL structure. This includes embodiments in which the filled trenches extend through at least 50% of the QCL structure. Each of the filled trenches further includes an upper trench layer 220 comprising a material having a higher index of refraction than the semi-insulating material. For example, in the embodiment shown in FIG. 2, the upper trench layer can be composed of n⁻-InGaAs. Each of the filled trenches may further optionally include an additional trench layer 222 above the upper trench layer comprising a highly thermally conductive material (e.g., n⁻-InP), and can still further include a layer of metal 212 (e.g., a ~3 μm layer of electroplated Au) over the additional trench layer 222. This metal may the same as, or different than, the metal in layer 213. FIG. 5 shows a schematic representation of the transverse refractive index profile through an interelement region (excluding the metal layer) for the device of FIG. 2.

The filled trench design depicted in FIG. 2 facilitates lateral heat removal from the element regions of the device, due to the presence of high thermal conductivity materials (i.e., InP) and the close proximity of the metal layer to the QCL structure. In addition, this filled trench design provides for intermodal discrimination against higher order array modes having non-negligible interelement fields, which facilitates lasing in the in-phase mode.

Although the width dimensions of the element 228 and interelement 230 regions can vary, the inventors have discovered that when the laser array devices are designed to meet the lateral resonance condition, the interelement regions are desirably about 5 to 6 μm wide. Also, in order to get a substantial amount of energy in the main lobe of the emitted far-field beam pattern, the ratio of the width of the element regions to the width of the interelement regions is desirably at least 3. That is, the element width is desirably at least about 15 μm. However, in devices having such wide element regions it is possible to generate array modes composed of out-of-phase coupled first-order element modes that are favored to lase when such array modes meet a lateral resonance condition. Such modes have negligible interelement fields and, thus, do not see loss in the interelement regions, which normally act to suppress lasing of all array modes except the desired in-phase resonant mode.

Therefore, in addition, the element regions of the device of FIG. 2 include absorption loss regions 224 extending into the optical confinement structure along the edges of the element regions. It is these absorption loss regions that provide the non-uniform structure across the width of the element regions. These regions are composed of a material, such as a metal (e.g., gold), that provides for absorption losses for array modes composed of higher order element modes (i.e., first-order or higher) that have negligible interelement fields and peak near the edges of the element regions. The metal of absorption loss regions 224 may the same as, or different than, that metal in layers 212 or 213. An undesirable array mode is illustrated in FIG. 1(b), which shows an out-of-phase array mode composed of coupled first-order element modes having negligible field in the interelement regions. The field intensity profiles in the element region of a five-element array for the mode composed of coupled fundamental element modes ("Mode 8") and for the mode composed of coupled first-order element modes ("Mode 13") in the element regions are shown in the lower left- and right-hand corners of FIG. 2, respectively. Additional description of out-of-phase coupled first-order modes can be found in Botez et al., *IEEE Journal of Quantum Electronics*, Vol. 26, No. 3, (1990). The dimensions of the absorption loss regions should be sufficiently large to create absorption losses for the unwanted array modes composed of coupled higher-order modes, without creating significant absorption losses for the array mode composed of coupled fundamental modes. By way of illustration only, in some embodiments of the devices, the absorption loss regions have a maximum thickness of about 5 μm and a minimum depth of about 1 μm.

Figure 6:
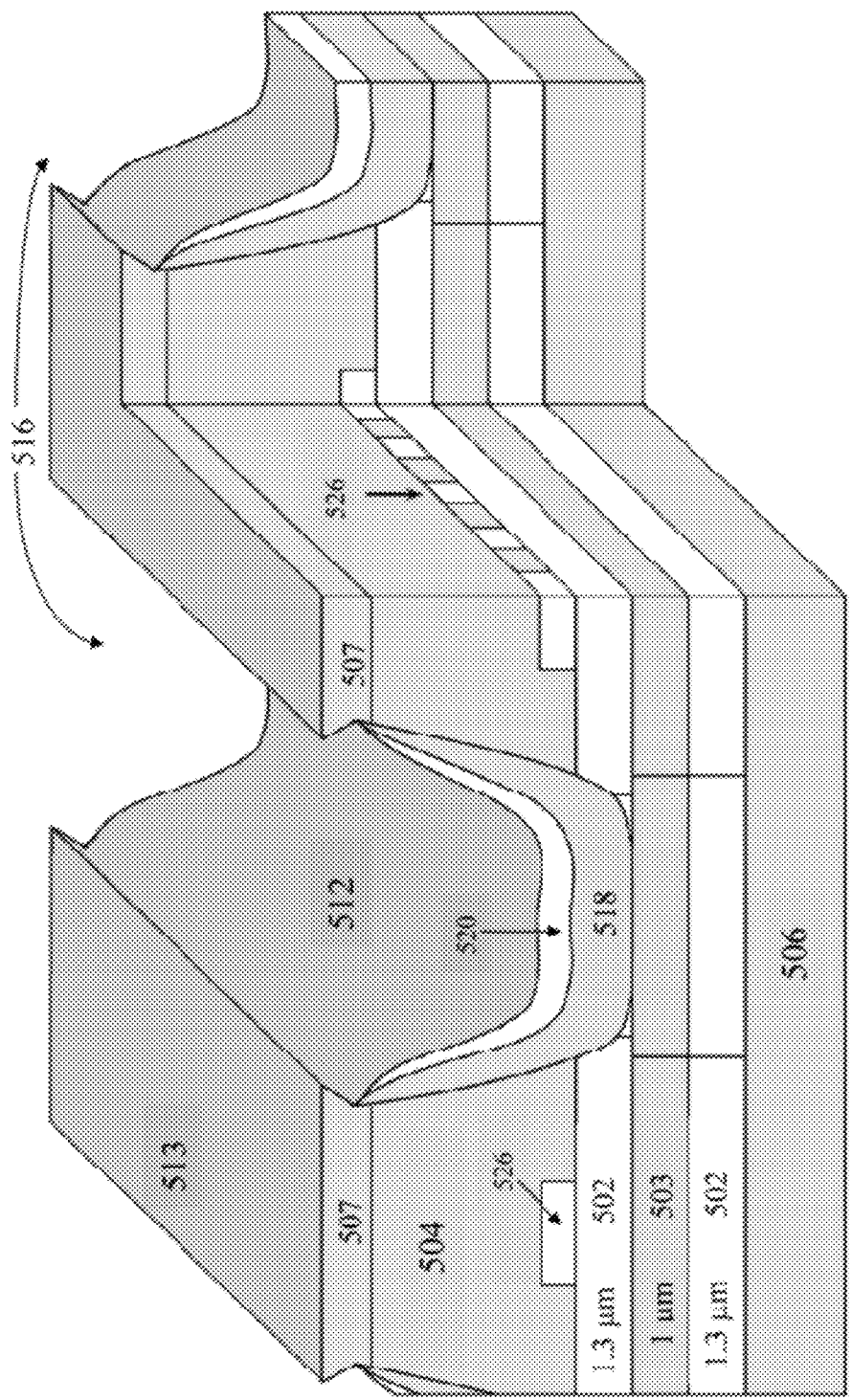
FIG. 6 shows a schematic cross-sectional view, with a partial cut-away, of a quantum cascade laser having and APC structure that includes diffraction gratings in the element regions.

FIG. 6 shows another semiconductor laser array device having a different element region design. Here, again, the dimensions provided in the figure are meant only to be illustrative. The device of FIG. 6 includes a QCL structure comprising two cores 502, each of which comprises a superlattice of quantum wells and barriers, separated by a layer of n⁻-InP 503. As in the device of FIG. 2, the cores in the device of FIG. 6 have multiple coupled laser stages, each of which includes an electron injector, an active lasing region having at least one quantum well, and an electron extractor. The device further includes an optical confinement structure comprising upper and lower optical confinement layers 504, 506, which can be composed of n⁻-InP, and an upper cladding layer 507, which can be composed of n+-InP.

Like the interelement regions of the laser array device of FIG. 2, the interelement regions shown in FIG. 6 are filled trenches 516 extending through the upper optical confinement structure and partially into the QCL structure 502, 503. Unlike the simplified trenches depicted in FIG. 2, the trenches in FIG. 6 have sloping sidewalls. Each of the filled trenches includes a lower trench layer 518 adjacent to the QCL structures in the neighboring element regions, the lower trench layer comprising a semi-insulating material (e.g., Fe-doped InP or semi-insulating InP). Each of the filled trenches further includes an upper trench layer 520 comprising a material having a higher index of refraction than the semi-insulating material. For example, in the embodiment shown in FIG. 6, the upper trench layer can be composed of n⁻-InGaAs. Each of the filled trenches may further optionally include an additional trench layer (not shown) above the upper trench layer comprising a highly thermally conductive material (e.g., n⁻-InP), and can still further include a relatively thick (e.g., ~3 μm thick) layer of metal 512, such as electroplated Au. Although shown as a thin layer in FIG. 6, metal 512 will typically fill in the trench. In addition, another layer of metal 513 can extend over the upper surfaces of both the element and interelement regions of the device. The metal of layer 513 can be same as, or different than, metal 512 in the trench. Although the trenches in the embodiment shown in FIG. 6 extend only to the n⁻-InP layer 503 between the two device cores, they could extend further into the QCL structure. For example, in some embodiments, the trenches penetrate almost to the second core.

In addition, the device of FIG. 6 includes distributed feedback (DFB) gratings 526 in the element region. It is these DFB gratings that provide the non-uniform structure across the width of the element regions. The DFB gratings are centrally located with lateral widths smaller than the widths of the element regions and are designed and positioned to provide preferential feedback for array modes composed of coupled fundamental element modes over array modes composed of coupled higher order element modes. By way of illustration only, the DFB grating may be 5 μm wide and composed of InGaAs and InP. Although the DFB grating is formed right above the upper core in the embodiment shown in FIG. 6, the grating could also be formed higher up in the element region, including at the interface with gold layer 512, in which case it can be designed as an InP/Au grating.

The present semiconductor laser array devices can be made by growing the QCL structure on a substrate using metalorganic chemical vapor deposition (MOCVD). The QCL structure can then be patterned with a dielectric mask to fabricate trenches by using a combination of reactive ion-etching and wet-chemical etching, and, using the same dielectric mask, preferential MOCVD regrowth can be utilized to form the interelement regions of the APC structure.

The present semiconductor laser array devices can operate at high power and high wallplug efficiencies during CW or quasi-CW operation. For example, some embodiments of the present devices provide an 8 μm-emitting laser with a diffraction-limited beam having an average output power of at least 2.5 W with a wallplug efficiency of at least 15% under quasi-CW operation at 20% duty cycle. This includes devices that provide 8 μm-wavelength lasing with a diffraction-limited beam having an average output power of at least 3 W with a wallplug efficiency of at least 20% under quasi-CW operation at 20% duty cycle.

EXAMPLE

The calculations provided in this example illustrate the ability of the present semiconductor laser array devices to select lasing in the in-phase array mode only.

Figure 7:
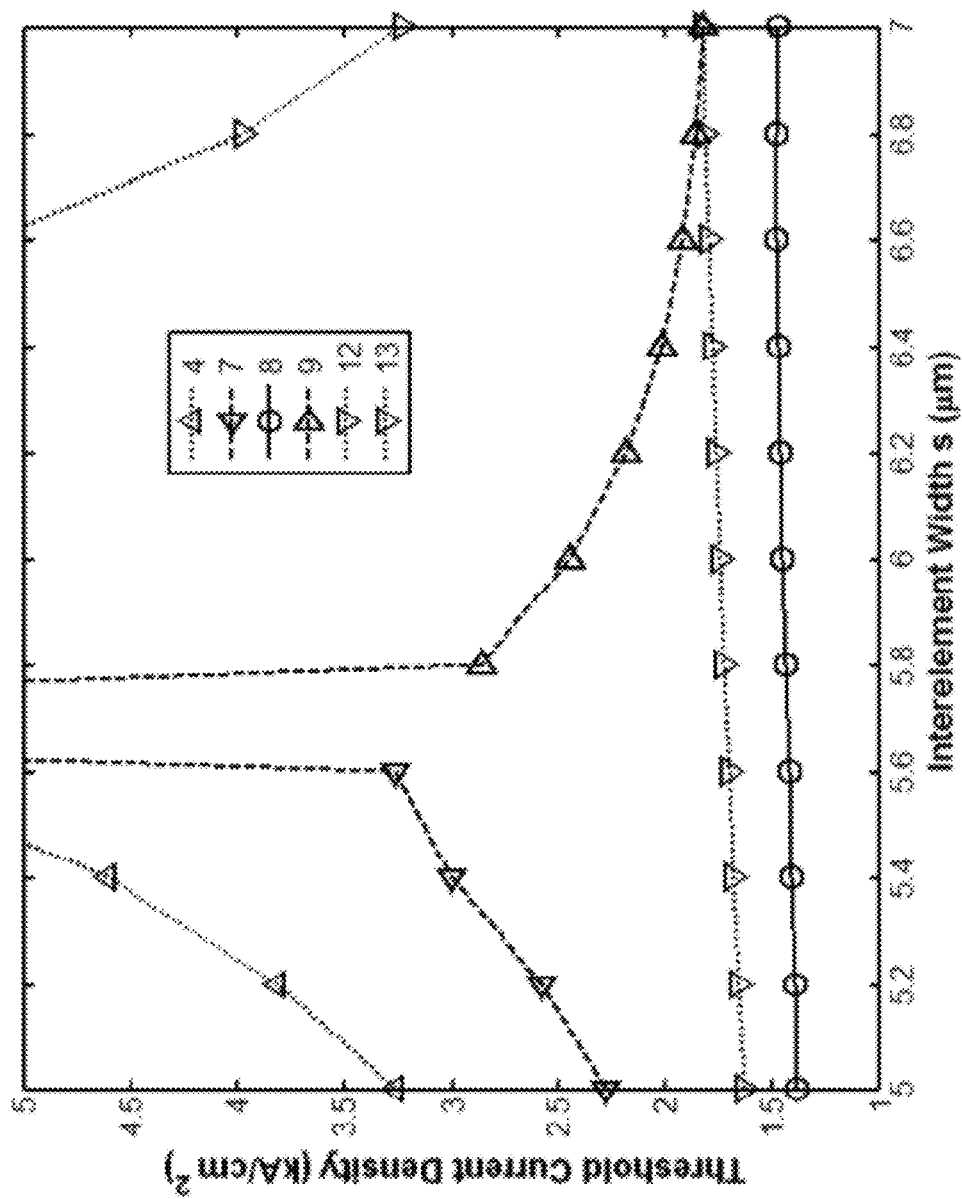
FIG. 7 shows the calculated threshold-current density, $J_{th}$, vs. interelement width, s, for relevant array modes in a device that does not discriminate against unwanted first-order modes in the element regions. Mode 8 is the desired in-phase array mode. Modes 7 and 9 are lower and upper adjacent array modes. Modes 4 and 12 are lower and upper array modes composed of out-of-phase coupled fundamental element modes. Mode 13 is an array mode composed of out-of-phase coupled first-order element modes.

At resonance, to get a significant amount of energy (i.e., ~67%) in the central far-field lobe, the element region width, d, is desirably about 3 times larger than s. For purposes of illustration, using a d value of 15 μm, a two-dimensional analysis for the structure shown in FIG. 2 containing five element regions, λ=8 μm can be performed. FIG. 7 shows the calculated threshold-current density, $J_{th}$, for the desired in-phase mode (Mode 8) and the high-order modes adjacent to it, for a device corresponding to that shown in FIG. 2, with a high-reflectivity (HR) coating on its back facet, but lacking the absorption loss regions in the element regions. For the $J_{th}$ values the following standard formula can be used:

$$J_{th,m} = \frac{\alpha_{end} + \alpha_{w,m}}{g\Gamma_{2D,m}} \quad (1)$$

where $\alpha_{end}$ is the mirror loss, $\alpha_{w,m}$ is the waveguide loss for the $m^{th}$ mode, g is the gain coefficient (~10 cm/kA for 8 μm QCLs) and $\Gamma_{2D,m}$ is the two-dimensional confinement factor for the $m^{th}$ mode. The mode discriminators are the $\alpha_{w,m}$ and the $\Gamma_{2D,m}$ terms as they vary significantly near the in-phase mode resonance. As seen from FIG. 7, an array mode composed of out-of-phase coupled first-order element modes (Mode 13), which is laterally resonant and thus has negligible interelement loss has similar threshold-current density, $J_{th}$, as the desired in-phase mode. This is problematic, since it will result in multimode operation.

Figure 8:
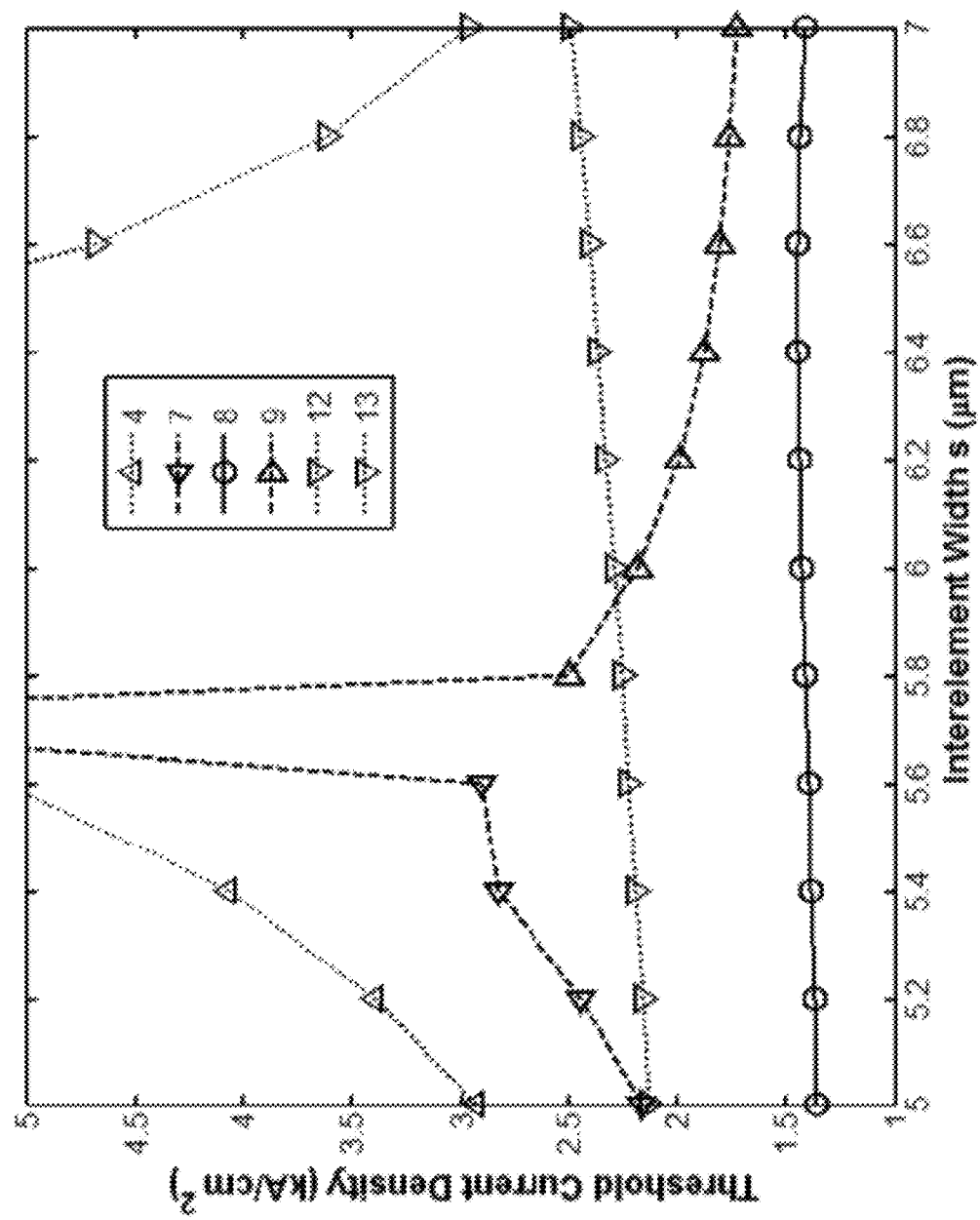
FIG. 8 shows the calculated threshold-current density, $J_{th}$, vs. interelement width, s, for relevant array modes of a 5-element array of the device shown in FIG. 2. The desired in-phase mode is strongly favored to lase over the s range: 5.0-6.0 µm.

In contrast, FIG. 8 shows the calculated threshold-current density, $J_{th}$, for the desired in-phase mode (Mode 8) and the high-order modes adjacent to it, for a device corresponding to that shown in FIG. 2, with a high-reflectivity (HR) coating on its back facet, and including the absorption loss regions in the element regions. As seen in FIG. 8, for this new array design mode 13 has a $J_{th}$ value at least 60% higher than that for the desired in-phase mode. Over an 1.0 μm-wide region in s variation (i.e., from 5.0 μm to 6.0 μm) the in-phase mode is strongly favored to lase. Furthermore, since at and near its resonance the in-phase mode has a highly uniform intensity profile across the entire array single, in-phase mode operation is assured to high drives above threshold.

As used herein, and unless otherwise specified, "a" or "an" means "one or more." All patents, applications, references, and publications cited herein are incorporated by reference in their entirety to the same extent as if they were individually incorporated by reference.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art, all language such as "up to," "at least," "greater than," "less than," and the like includes the number recited and refers to ranges which can be subsequently broken down into subranges as discussed above. Finally, as will be understood by one skilled in the art, a range includes each individual member.

It is specifically intended that the present invention not be limited to the embodiments and illustrations contained herein, but include modified forms of those embodiments including portions of the embodiments and combinations of elements of different embodiments as come within the scope of the following claims.

What is claimed is:

1. A semiconductor laser array device comprising:
   (a) a quantum cascade laser structure comprising a core;
   (b) an optical confinement structure comprising at least one upper layer of optical confinement material above the quantum cascade laser structure and at least one lower layer of optical confinement material below the quantum cascade laser structure;
   (c) a cladding structure comprising at least one upper layer of cladding material above the optical confinement structure; and
   (d) a plurality of laterally-spaced trench regions extending transversely, at least partially into the quantum cascade laser structure, wherein each trench region comprises a lower trench layer comprising a semi-insulating material and an upper trench layer comprising a material having a refractive index that is higher than the refractive index of the semi-insulating material;
   wherein the trench regions define interelement regions separated by element regions in the laser array device, and further wherein the element regions are characterized by a non-uniform structure across their widths, whereby array modes composed of coupled first-order lateral modes of the element regions are preferentially suppressed relative to array modes composed of coupled fundamental lateral modes of the element regions;
   the laser array device characterized in that it is designed to produce an array mode composed of coupled fundamental lateral modes meeting a lateral resonance condition in which there is strong coupling via leaky waves between all of the element regions.

2. The device of claim 1, wherein the array mode composed of coupled fundamental lateral modes, that the device is designed to produce, is of the in-phase type.

3. The device of claim 1, wherein the non-uniform structure across the width of an element region is provided by absorption loss regions comprising a metal and extending at least partially through the upper layer of cladding material along the edges of the element region.

4. The device of claim 1, wherein the non-uniform structure across the width of an element region is provided by a diffraction grating disposed centrally within or above the upper optical confinement layer of the element region.

5. The device of claim 1, wherein each trench region further comprises a layer of thermally conducting material disposed above the upper trench layer.

6. The device of claim 4, further comprising a layer of metal disposed over the at least one upper cladding layer.

7. The device of claim 1, wherein the device is configured to emit at 8 μm with at least 2.5 Watts of coherent average output power during continuous or quasi-continuous wave operation.

8. The device of claim 7, wherein the device is configured to provide a wallplug efficiency of at least 15%.

9. The device of claim 1, wherein the width of the element regions is about 4 times the width of the interelement regions.

10. The device of claim 1, wherein the trench regions extend through at least 25% of the quantum cascade laser structure thickness.

11. The device of claim 1, further comprising boundary regions adjacent to the element regions at the outer edges of the laser array, the boundary regions comprising the same materials as the trench regions.

12. The device of claim 1, wherein the core comprises multiple coupled laser stages each of which includes an electron injector, an active lasing region having at least one quantum well, and an electron extractor.

13. The device of claim 12, wherein the active lasing regions have a deep-well structure.

14. The device of claim 12, wherein the active lasing regions have a tapered-active structure.

15. The device of claim 4, wherein the core comprises multiple coupled laser stages each of which includes an electron injector, an active lasing region having at least one quantum well, and an electron extractor, the quantum cascade laser structure comprising alternating AlInAs barrier layers and InGaAs well layers.

16. The device of claim 14, wherein the active lasing regions have a deep-well structure.

17. The device of claim 15, wherein the lower trench layer comprises InP, the upper trench layer comprises $n^-$-InGaAs and the thermally conducting material comprises $n^-$-InP.

* * * * *